United States Patent
Fan et al.

(10) Patent No.: US 6,982,491 B1
(45) Date of Patent: Jan. 3, 2006

(54) SENSOR SEMICONDUCTOR PACKAGE AND METHOD OF MANUFACTURING THE SAME

(75) Inventors: Chun Ho Fan, Sham Tseng (HK); Sadak Thamby Labeeb, Tsuen Wan (HK); Lap Keung Chow, Kowloon (HK)

(73) Assignee: ASAT Ltd., New Territories (HK)

( * ) Notice: Subject to any disclaimer, the term of this patent is extended or adjusted under 35 U.S.C. 154(b) by 60 days.

(21) Appl. No.: 10/759,247

(22) Filed: Jan. 20, 2004

(51) Int. Cl.
H01L 23/48 (2006.01)
H01L 23/52 (2006.01)
H01L 29/40 (2006.01)

(52) U.S. Cl. .................. 257/778; 257/370; 257/737; 257/738; 257/773; 257/780; 257/782; 257/784; 257/786; 257/788; 257/795; 257/E23.021

(58) Field of Classification Search .......... 257/738, 257/778, 780, 788, 795, E23.021, 138, E23.01, 257/730, 737, 773, 782, 784, 786
See application file for complete search history.

(56) References Cited

U.S. PATENT DOCUMENTS

| | | | |
|---|---|---|---|
| 5,900,675 A * | 5/1999 | Appelt et al. | 257/778 |
| 6,084,308 A * | 7/2000 | Kelkar et al. | 257/777 |
| 6,114,755 A * | 9/2000 | Ito et al. | 257/675 |
| 6,380,631 B2 * | 4/2002 | Mess et al. | 257/777 |
| 6,469,897 B2 * | 10/2002 | Ho et al. | 361/704 |
| 6,483,187 B1 * | 11/2002 | Chao et al. | 257/712 |
| 6,528,869 B1 * | 3/2003 | Glenn et al. | 257/678 |
| 6,599,774 B2 * | 7/2003 | Hultmark et al. | 438/107 |
| 6,656,768 B2 * | 12/2003 | Thomas | 438/108 |
| 6,744,125 B2 * | 6/2004 | Camenforte et al. | 257/678 |
| 6,879,031 B2 * | 4/2005 | Wang | 257/686 |
| 2001/0001505 A1 * | 5/2001 | Schueller et al. | 257/738 |
| 2002/0081755 A1 * | 6/2002 | Degani et al. | 438/14 |
| 2002/0127771 A1 * | 9/2002 | Akram et al. | 438/107 |
| 2002/0130422 A1 * | 9/2002 | Venkateshwaran | 257/778 |
| 2003/0151148 A1 * | 8/2003 | Camenforte et al. | 257/780 |
| 2004/0080046 A1 * | 4/2004 | Choon Kuan et al. | 257/738 |
| 2004/0084738 A1 * | 5/2004 | Thomas | 257/414 |
| 2005/0046039 A1 * | 3/2005 | Yang et al. | 257/778 |
| 2005/0051859 A1 * | 3/2005 | Hoffman | 257/434 |

OTHER PUBLICATIONS

Dr. Ken Gilleo, MEMS Packaging Issues and Materials, Cookson Electronics.

* cited by examiner

Primary Examiner—Amir Zarabian
Assistant Examiner—Ida M. Soward
(74) Attorney, Agent, or Firm—Keating & Bennett, LLP

(57) ABSTRACT

A process for fabricating an integrated circuit package includes: providing a substrate having conductive traces therein, the substrate including a cavity therein; mounting a semiconductor die to a first surface of the substrate, in a flip-chip orientation such that a sensor portion of the semiconductor die is aligned with the cavity and conductive interconnects connect pads of the semiconductor die to the conductive traces of the substrate; filling an area surrounding the interconnects with an underfill material; and mounting a plurality of conductive balls on the first surface of the substrate and in electrical connection with the conductive traces such that ones of the conductive balls are connected to ones of the pads of the semiconductor die via the conductive traces.

14 Claims, 5 Drawing Sheets

SENSOR SEMICONDUCTOR PACKAGE AND METHOD OF MANUFACTURING THE SAME

FIELD OF THE INVENTION

The present invention relates in general to integrated circuit packaging, and more particularly to an integrated circuit package for micro electro-mechanical systems integrated circuit chips and a method of manufacturing the same.

BACKGROUND OF THE INVENTION

High performance integrated circuit (IC) packages are well known in the art. Improvements in IC packages are driven by industry demands for increased thermal and electrical performance and decreased size and cost of manufacture.

Micro electro-mechanical systems (MEMS) integrated circuit chips and micro optic electromechanical (MOEMS) integrated circuit chips (all generally referred to herein as MEMS) are unique chips used in a variety of applications. MEMS chips commonly include sensors for the detection of signals, such as motion, light, sound, pressure, chemical, radio waves, etc. and are generally employed in carrying out specific tasks based on programmable logic.

Improvements in integrated circuit packages including MEMS chips are driven by traditional industry demands as well as additional demands for properties that are uniquely desirable for MEMS packages. Some of these desired properties for MEMS packaging include, for example, high chip placement accuracy for MEMS packages used in photonics, effective signal transmission to the sensor area of the MEMS chip, and good isolation of the sensor area of the MEMS chip from packaging materials for protection against stress, freedom of movement for parts of motion sensing chips, and protection of the sensor against damage. Other desirable properties include high mechanical rigidity, high degree of die cleanliness and good reliability.

In the past, MEMS integrated circuit packages have been manufactured in several different ways. These packages have limitations, however, such as low cost-effectiveness, die placement accuracy, signal transmission and other limitations.

It is desirable to provide a MEMS integrated circuit package with improved properties desirable in MEMS and optical sensor packages.

SUMMARY OF THE INVENTION

In one aspect of the present invention, there is provided a process for fabricating an integrated circuit package. The process includes: providing a substrate having conductive traces therein, the substrate also having a cavity therein; mounting a semiconductor die to a first surface of the substrate, in a flip-chip orientation such that a sensor portion of the semiconductor die is aligned with the cavity and conductive interconnects connect pads of the semiconductor die to the conductive traces of the substrate; filling an area surrounding the interconnects with an underfill material; and mounting a plurality of conductive balls on the first surface of the substrate and in electrical connection with the conductive traces such that ones of the conductive balls are connected to ones of the pads of the semiconductor die via the conductive traces.

In another aspect of the present invention, there is provided an integrated circuit package. The package includes a substrate having conductive traces therein, the substrate also having a cavity therein. A semiconductor die is mounted to a first surface of the substrate, in a flip-chip orientation such that a sensor portion of the semiconductor die is aligned with the cavity and conductive interconnects connect pads of the semiconductor die to the conductive traces of the substrate. An underfill material surrounds the interconnects. A plurality of conductive balls are disposed on the first surface of the substrate, the conductive balls being electrically connected to the conductive traces such that ones of the conductive balls are connected to ones of the pads of the semiconductor die via the conductive traces.

Several advantages are realized in aspects of embodiments of the present invention. The flip-chip orientation of the semiconductor die provides high placement accuracy. The process for manufacturing the package permits different media to be placed in contact with the sensor portion of the die for increasing signal transmission while inhibiting signal distortion caused by the packaging media. The underfill material provides protection against stress induced on the interconnect due to thermal mismatch between the die and substrate. Reliability of the package is enhanced by reducing the interface to the die.

BRIEF DESCRIPTION OF THE DRAWINGS

The invention will be better understood with reference to the drawings and the following description, in which.

DETAILED DESCRIPTION OF THE PREFERRED EMBODIMENTS

Figure 1:
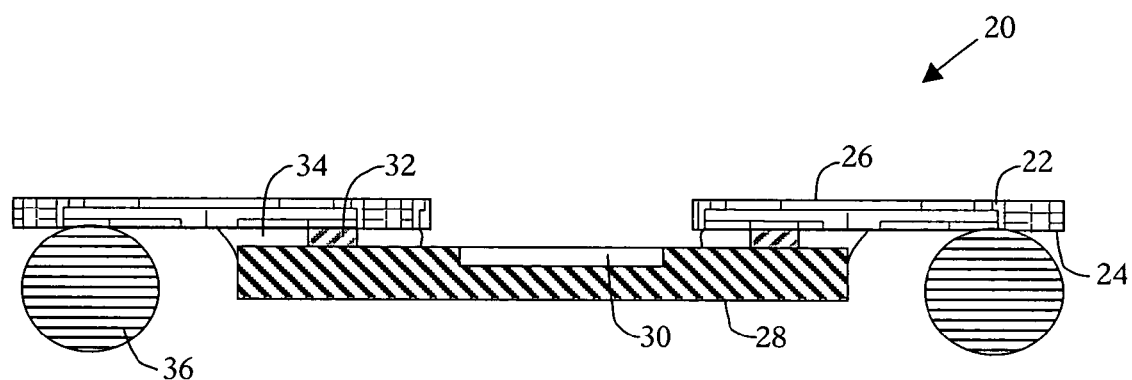
FIG. 1 is a sectional side view of an integrated circuit package according to an embodiment of the present invention.

Reference is first made to FIG. 1, which shows a sectional side view of an integrated circuit package indicated generally by the numeral 20. The integrated circuit package 20 includes a substrate 22 having conductive traces therein. A cavity is disposed in the substrate 22. A semiconductor die 28 is mounted to a first surface 24 of the substrate 22, in a flip-chip orientation such that a sensor portion 30 of the semiconductor die 28 is aligned with the cavity. Conductive interconnects 32 connect pads of the semiconductor die 28 to the conductive traces of the substrate 22. An underfill material 34 surrounds the interconnects 32. A plurality of conductive balls 36 are disposed on the first surface 24 of the substrate 22. The conductive balls 36 are electrically connected to the conductive traces such that ones of the conductive balls 36 are connected to ones of the pads of the semiconductor die 28 via the conductive traces.

Figure 2A:
FIGS. 2A to 2E show processing steps for fabricating the integrated circuit package of FIG. 1.

The integrated circuit package 20 will now be described in more detail with reference to FIGS. 2A to 2E to describe processing steps for fabricating the integrated circuit package 20 in accordance with an embodiment of the present invention. Referring first to FIG. 2A, the substrate 22 of a bismaleimidetriazine (BT) resin/glass epoxy printed circuit board is shown. The substrate 22 includes conductive metal or alloy traces than provide conductive paths for signal transfer. The conductive traces are patterned during manufacture of the substrate 22. The substrate 22 manufacturing and patterning of the conductive traces are well known and will be well understood by those skilled in the art. The substrate 22 also includes the cavity that is formed using known techniques during manufacture of the substrate 22 and extends through the thickness of the substrate 22, from the first surface 24 to an opposing second surface 26.

The substrate 22 is in the form of a strip for producing a number of integrated circuit packages 20. Only one such unit is depicted in FIGS. 2A to 2E, portions of adjacent units being shown by stippled lines. The present discussion refers to the fabrication of a single integrated circuit package 20 for the purpose of simplicity only and it will be understood that the package 20 is preferably gang fabricated.

Figure 2B:
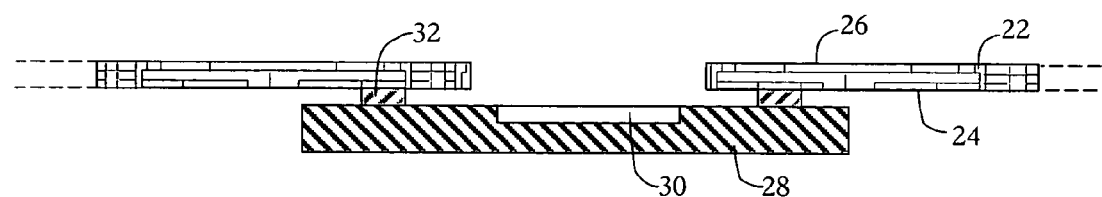

Referring now to FIG. 2B, the semiconductor die 28 is then mounted in a flip-chip orientation by connection of the pads of the semiconductor die 28 to the conductive traces of the substrate 22 with the conductive interconnects 32. To mount the semiconductor die 28, solder balls, which form the conductive interconnects 32, are disposed on the semiconductor die 28, using any of the established techniques available in the industry. The semiconductor die 28 is then mounted on the substrate 22 via the conductive interconnects such that the sensor portion 30 of the semiconductor die 28 is aligned with the cavity of the substrate 22, as shown. It will be appreciated that the pads of the semiconductor die 28 align with the portions of the conductive traces and the conductive interconnects 32 electrically connect the semiconductor die 28 with ones of the conductive traces of the substrate 22.

Figure 2C:
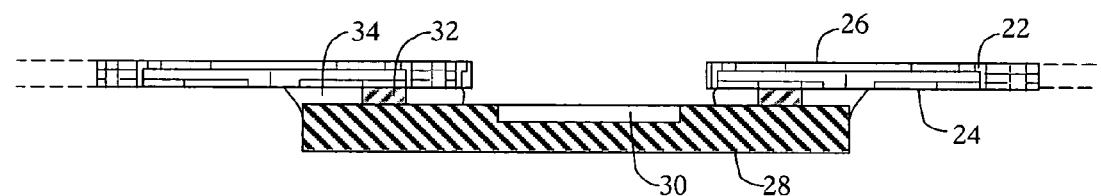

The area around the conductive interconnects 32 is then filled with a thermosetting polymer, referred to above as the underfill material 34. The underfill material 34 surrounds the interconnects 32 and fills the area between the semiconductor die 28 and the substrate 22, as shown in FIG. 2C. Care is taken to inhibit the underfill material 34 from covering the sensor portion 30 of the semiconductor die 30, leaving the sensor portion 30 exposed to air.

Figure 2D:
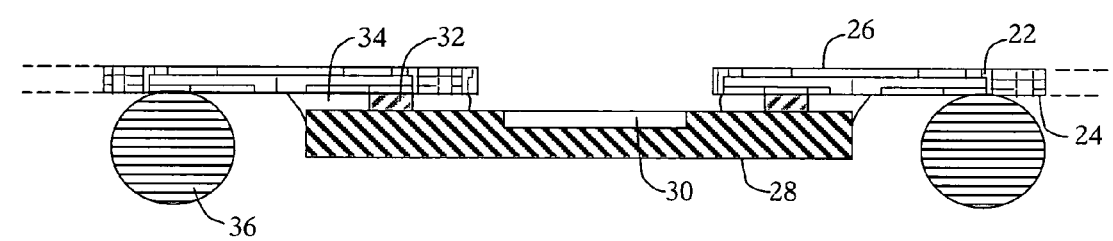

Next, the plurality of conductive balls 36, commonly referred to as solder bumps, are placed on the first surface 24 of the substrate 22, in connection with ones of the conductive traces of the substrate 22, by conventional positioning (FIG. 2D). To attach the conductive balls 36, a flux is added to the conductive balls 36 prior to placement and, after placement, the balls 36 are reflowed using known reflow techniques. The conductive balls 36 are thereby connected to the conductive traces of the substrate 22 and through the interconnects 32, to the semiconductor die 26. The conductive balls 36 provide signal and power connections as well as ground connections for the semiconductor die 28. Clearly the conductive balls 36 are suitably sized to provide clearance between a back side of the semiconductor die 28 and a printed circuit board surface (not shown) when the package 20 is mounted on a printed circuit board.

Figure 2E:
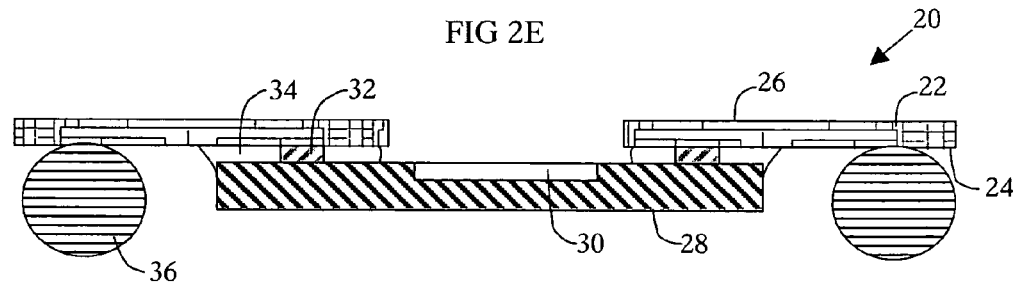

Singulation of the individual integrated circuit package 20 from the strip is then performed either by saw singulation or die punching, resulting in the configuration shown in FIG. 2E. Thus, the individual package 20 is isolated from other packages of the strip.

Figure 3A:
FIGS. 3A to 3G show processing steps for fabricating an integrated circuit package according to another embodiment of the present invention.
Figure 3B:
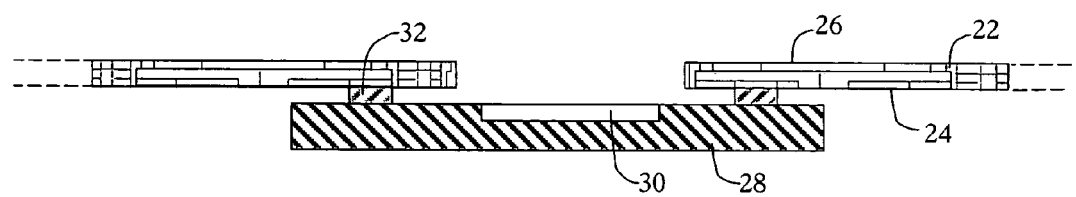
Figure 3C:
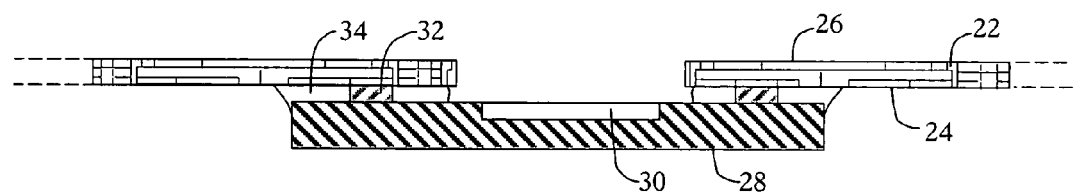
Figure 3D:
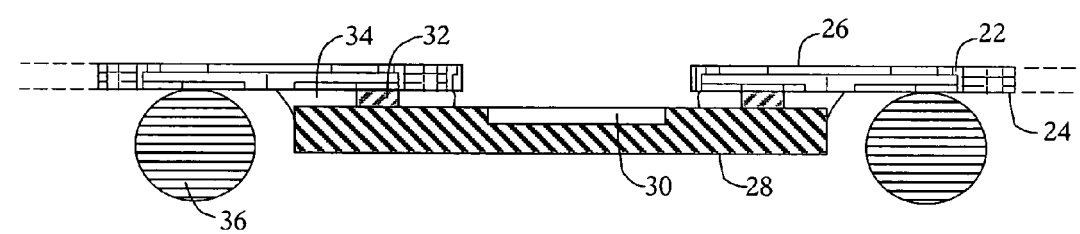

Reference is now made to FIGS. 3A to 3G to describe a process for manufacturing an integrated circuit package 20 according to another embodiment of the present invention. FIGS. 3A to 3C are similar to FIGS. 2A to 2C and therefore are not further described herein. As in the first described embodiment, a plurality of conductive balls 36 are placed on the first surface 24 of the substrate 22, in connection with ones of the conductive traces of the substrate 22, by conventional positioning (FIG. 3D). To attach the conductive balls 36, a flux is added to the conductive balls 36 prior to placement and, after placement, the balls 36 are reflowed using known reflow techniques. The conductive balls 36 are thereby connected to the conductive traces of the substrate 22 and through the interconnects 32, to the semiconductor die 26. In the present embodiment, however, the conductive balls 36 serve as I/O (input/output) redistribution balls, rather than serving as second level interconnects. The conductive balls 36 are suitably sized to provide appropriate stand-off for the semiconductor die 28.

Figure 3E:
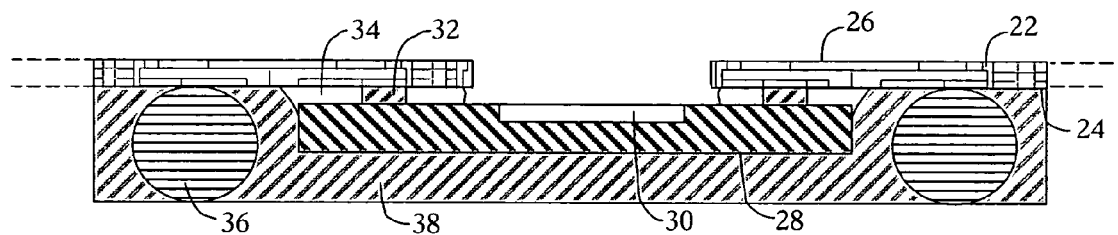
Figure 3F:
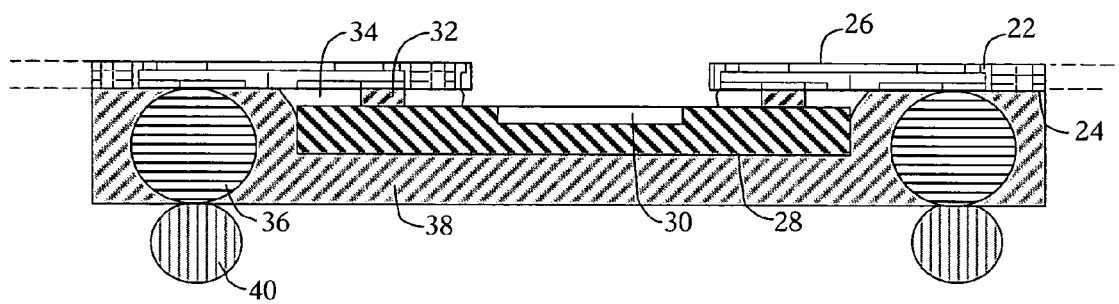

Referring to FIG. 3E, the back side of the semiconductor die 28 and the conductive balls 36 (I/O redistribution balls) are encapsulated in an overmold compound 38 such that the conductive balls 36 are exposed at a surface thereof, for providing a connection surface for attaching second level interconnect balls 40. Next, the second level interconnect balls 40 are attached to the exposed surfaces of the conductive balls 36 by conventional positioning techniques (FIG. 3F). In the present embodiment, the second level interconnect balls 40 are electrically connected to the semiconductor die 28 via the conductive balls 36, the conductive traces of the substrate 22 and the interconnects 32.

Figure 3G:
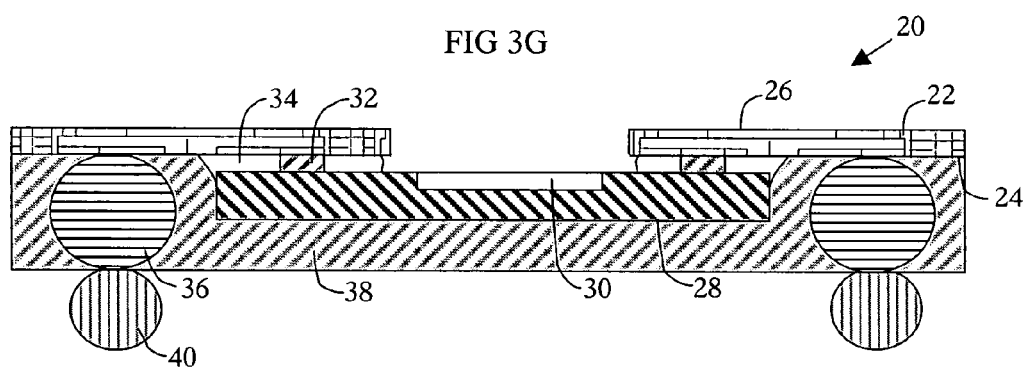

Singulation of the individual integrated circuit package 20 from the strip is then performed either by saw singulation or die punching, resulting in the configuration shown in FIG. 3G. Thus, the individual package 20 is isolated from other packages of the strip.

Figure 4:
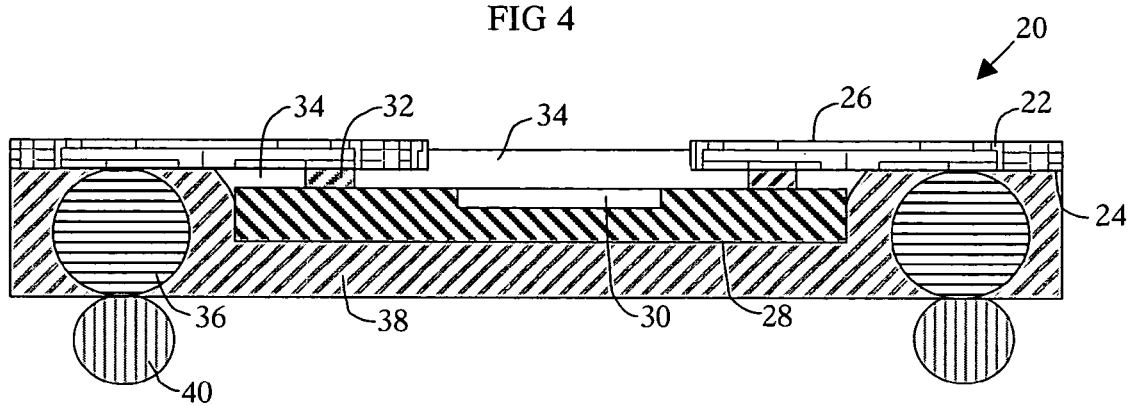
FIG. 4 shows a sectional side view of an integrated circuit package according to still another embodiment of the present invention.

Several variations and modifications can be made to the embodiments described herein. An alternative embodiment of the package is shown in FIG. 4 in which the underfill material 34 covers the sensor portion 30 of the semiconductor die 30 rather than leaving the sensor portion 30 exposed to air. Thus, the sensor portion 30 of the semiconductor die 28 is covered with the polymeric underfill material 34 or other material suitable for the package 20 being manufactured.

Figure 5:
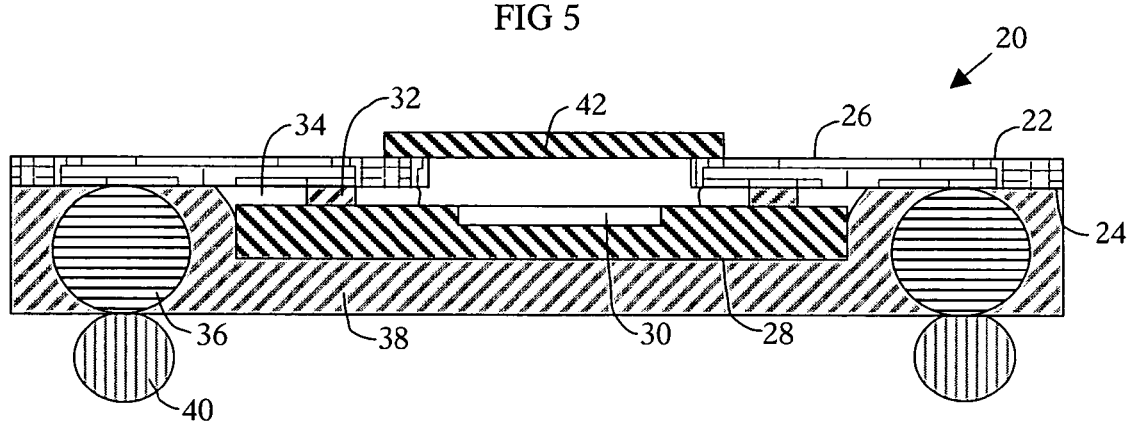
FIG. 5 shows a sectional side view of an integrated circuit package according to yet another embodiment of the present invention.

In another embodiment, a lid 42 of, for example, glass is attached to the second surface 26 of the substrate 22, thereby covering and protecting the sensor portion 30 of the semiconductor die 28, as shown in FIG. 5. The lid 42 is attached to the surface of the substrate 22 after underfilling with the underfill material 34, as shown in FIG. 2C. In this embodiment, a cleaning step is added to remove possible contamination of the semiconductor die 28, prior to attaching the lid 42. The lid is then immediately attached to inhibit any contamination from the environment or assembly process from settling on the semiconductor die 28. Thus, the lid 42 protects the surface of the sensor portion 30 of the semiconductor die 28.

Other materials can be used to cover the sensor portion 30 of the semiconductor die 28, depending on the intended application of the integrated circuit package 20. These materials are used, for example, for light filters, stress absorbers, ionic corrosion protection or many other functions. For example, for photonic applications, the sensor portion 30 is covered with either air accompanied by a glass lid or with a transparent encapsulant. In other exemplary applications, light filters are also employed. Clearly, transmission is an important aspect and appropriate materials are selected to inhibit selective blocking of desired wavelengths by package media. For a pressure sensor application, the sensor portion 30 is covered either with air or with a low stress encapsulant. In this application, appropriate materials are selected to inhibit thermally variable stresses exerted by packaging media on the die and to inhibit pressure damping by the material. A motion sensor includes moveable parts and for this application the sensor portion 30 is covered by air.

Specific embodiments and variations of embodiments of the present invention have been shown and described herein. However, other variations and modifications to these embodiments may occur to those skilled in the art. For example, the substrate 22 is not limited to the BT resin/glass epoxy printed circuit board as described and other suitable substrate materials can be employed. Also, the conductive interconnects 32 are not limited to solder ball conductive interconnects, as described. Other conductive interconnect materials can be used, including, for example, gold, copper, aluminum and conductive polymers.

Still other variations and modifications may occur to those skilled in the art. All such modifications and variations are believed to be within the sphere and scope of the present invention.

What is claimed is:

1. An integrated circuit package comprising:
    a substrate having conductive traces therein, the substrate including a cavity therein;
    a semiconductor die mounted to a first surface of the substrate, in a flip-chip orientation such that a sensor portion of said semiconductor die is aligned with said cavity and conductive interconnects connect pads of the semiconductor die to said conductive traces of said substrate;
    an underfill material surrounding said interconnects;
    a plurality of conductive balls disposed on said first surface of said substrate, said conductive balls being electrically connected to said conductive traces such that ones of said conductive balls are connected to ones of said pads of said semiconductor die via said conductive traces; and
    an overmold material covering a back side of said semiconductor die and said plurality of conductive balls such that portions of said conductive balls are exposed.

2. The integrated circuit package according to claim 1, wherein said semiconductor die is a micro electro-mechanical system integrated circuit chip.

3. The integrated circuit package according to claim 1, further comprising a plurality of second level interconnects connected to the exposed portions of ones of said conductive balls.

4. The integrated circuit package according to claim 1, further comprising a lid disposed on a second surface of said substrate and covering said sensor portion of said semiconductor die.

5. The integrated circuit package according to claim 1, wherein said underfill comprises a polymeric encapsulant.

6. The integrated circuit package according to claim 1, wherein said sensor portion of said semiconductor die is exposed to air.

7. The integrated circuit package according to claim 1, wherein said sensor portion of said semiconductor die is covered with a polymeric material.

8. A process for fabricating an integrated circuit package, comprising:
    providing a substrate having conductive traces therein, the substrate including a cavity therein;
    mounting a semiconductor die to a first surface of the substrate, in a flip-chip orientation such that a sensor portion of said semiconductor die is aligned with said cavity and conductive interconnects connect pads of the semiconductor die to said conductive traces of said substrate;
    filling an area surrounding said interconnects with an underfill material;
    mounting a plurality of conductive balls on said first surface of said substrate and in electrical connection with said conductive traces such that ones of said conductive balls are connected to ones of said pads of said semiconductor die via said conductive traces; and
    overmolding using an overmold material to cover a back side of said semiconductor die and said plurality of conductive balls such that portions of said conductive balls are exposed.

9. The process according to claim 8, wherein mounting said semiconductor die comprises mounting a micro electromechanical system integrated circuit chip.

10. The process according to claim 8, further comprising mounting a plurality of second level interconnects to the exposed portions of ones of said conductive balls.

11. The process according to claim 8, further comprising mounting a lid on a second surface of said substrate such that said lid covers said sensor portion of said semiconductor die.

12. The process according to claim 8, wherein filling an area surrounding said interconnects with an underfill material comprises filling said area with a polymeric encapsulant.

13. The process according to claim 8, further comprising singulating said integrated circuit package from a remainder of a strip of gang-fabricated packages.

14. The process according to claim 8, wherein said mounting the semiconductor die includes locating the conductive interconnects on to the semiconductor die and then attaching the die to the corresponding conductive pads on the substrate.

* * * * *